(12) United States Patent
Lin

(10) Patent No.: US 7,878,831 B2
(45) Date of Patent: Feb. 1, 2011

(54) ELECTRICAL CONNECTOR HAVING DETACHABLE GUIDING MEMBER

(75) Inventor: Wei-Chih Lin, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/719,838

(22) Filed: Mar. 8, 2010

(65) Prior Publication Data

US 2010/0227490 A1 Sep. 9, 2010

(30) Foreign Application Priority Data

Mar. 9, 2009 (TW) .................................. 98203553

(51) Int. Cl.
*H01R 13/62* (2006.01)

(52) U.S. Cl. ....................................... 439/259; 439/347

(58) Field of Classification Search ................... 439/68, 439/71, 73, 342, 259, 347
See application file for complete search history.

(56) References Cited

U.S. PATENT DOCUMENTS

| 6,261,114 B1 * | 7/2001 | Shimada ..................... 439/266 |
| 7,121,858 B2 | 10/2006 | Chen |
| 7,494,357 B2 * | 2/2009 | Chen et al. .................. 439/259 |
| 7,753,703 B2 * | 7/2010 | Liao et al. ................... 439/261 |

* cited by examiner

*Primary Examiner*—Khiem Nguyen
(74) *Attorney, Agent, or Firm*—Andrew C. Cheng; Wei Te Chung; Ming Chieh Chang

(57) ABSTRACT

An electrical connector (100) electrically connects a first IC package (800) having a first width and a second IC package (900) having a second width different from the first width. The electrical connector includes an insulative housing (2) defining a number of contact recesses (20), a number of contacts (3) inserted in the contact recesses, a connecting member (4) mounted on the insulative housing, and a number of guiding members (6) assembled to the connecting member for guiding the first IC package in the connecting member at a first state, and detachable from the connecting member for facilitating insertion of the second IC package in the connecting member at a second state.

7 Claims, 8 Drawing Sheets

ELECTRICAL CONNECTOR HAVING
DETACHABLE GUIDING MEMBER

BACKGROUND OF THE INVENTION

1. Field of the Invention

The present invention relates to an electrical connector, and more particularly to a burn-in test socket having a guiding member assembled to the housing and detachable from the housing.

2. Description of Related Art

U.S. Pat. No. 7,121,858 issued to Chen on Oct. 17, 2006 discloses an electrical connector. The electrical connector comprises an insulative housing, a connecting member mounted on the insulative housing and having a connecting face supporting the IC package, a latch and an actuator mounted on the insulative housing, and a pair of springs mounted between the actuator and the insulative housing. The latch is formed with a locking portion and a pivot connected with the locking portion. The actuator is formed with a depressing portion resisting against the locking portion. When the actuator is pushed downwardly, the depressing portions depress the latch and upwardly opening the locking portions. The IC package could be put into or pulled out from the connecting face of the insulative housing.

The connecting face should be designed into a dimension corresponding to that of the selected IC package. The electrical connector could connect with only one type of the IC package. It is impossible to connect with two types of IC package, such as TSOP 56 (Thin Small Outline Package 56) and TSOP 48 (Thin Small Outline Package 48), by the conventional electrically connector.

Hence, an electrical connector having detachable guiding member is required to overcome the above-mentioned disadvantages of the related art.

SUMMARY OF THE INVENTION

An object of the present invention is to provide a burn-in test socket having a guiding member assembled to and detachable from the housing for adjusting the dimension of the connecting region, to connect with two types of IC package.

To achieve the aforementioned objects, an electrical connector electrically connects a first IC package having a first width and a second IC package having a second width different from the first width. The electrical connector includes an insulative housing defining a number of contact recesses, a number of contacts inserted in the contact recesses, a connecting member mounted on the insulative housing, and a number of guiding members assembled to the connecting member for guiding the first IC package in the connecting member at a first state, and detachable from the connecting member for facilitating insertion of the second IC package in the connecting member at a second state.

The electrical connector could be connected with two types of IC package having different widths, in a condition that the guiding members are assembled to or disassembled from the connecting member. The guiding members could be designed into different dimensions to guide in different types of IC package.

Other objects, advantages and novel features of the invention will become more apparent from the following detailed description of a preferred embodiment when taken in conjunction with the accompanying drawings.

DETAILED DESCRIPTION OF THE INVENTION

Figure 1:
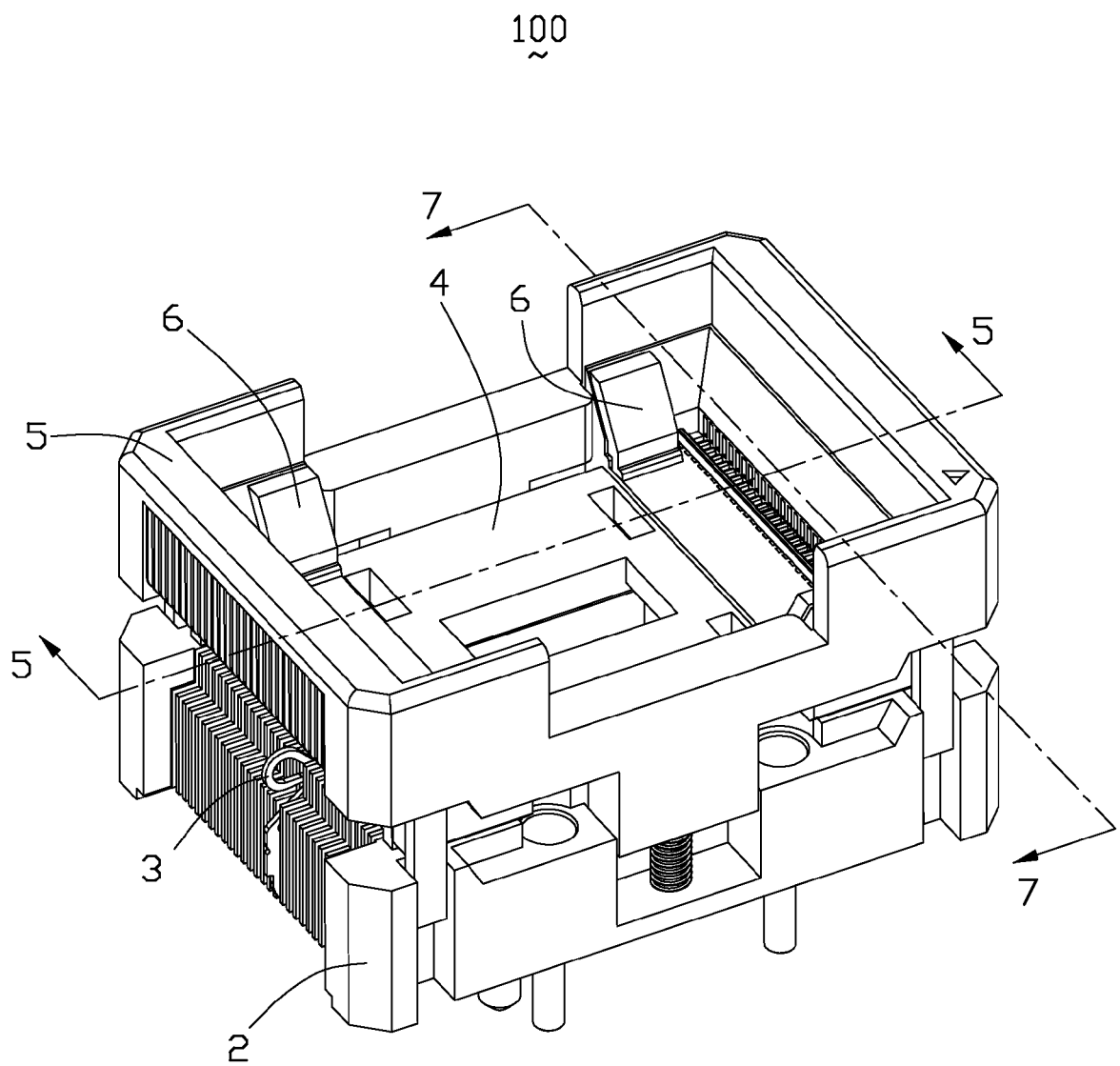
FIG. 1 is an assembled perspective view showing an electrical connector in accordance with the present invention.

Reference will now be made to the drawing figures to describe the present invention in detail. Referring to FIGS. 1-8, an electrical connector 100 in accordance with the preferred embodiment of the present invention is adapted for electrically connecting with a first and a second IC package 800, 900 having different widths. The electrical connector 100 comprises an insulative housing 2, a plurality of contacts 3, a pair of springs 23, a connecting member 4, an actuator 5, a plurality of guiding members 6, and a plurality of bolts 7.

Figure 3:
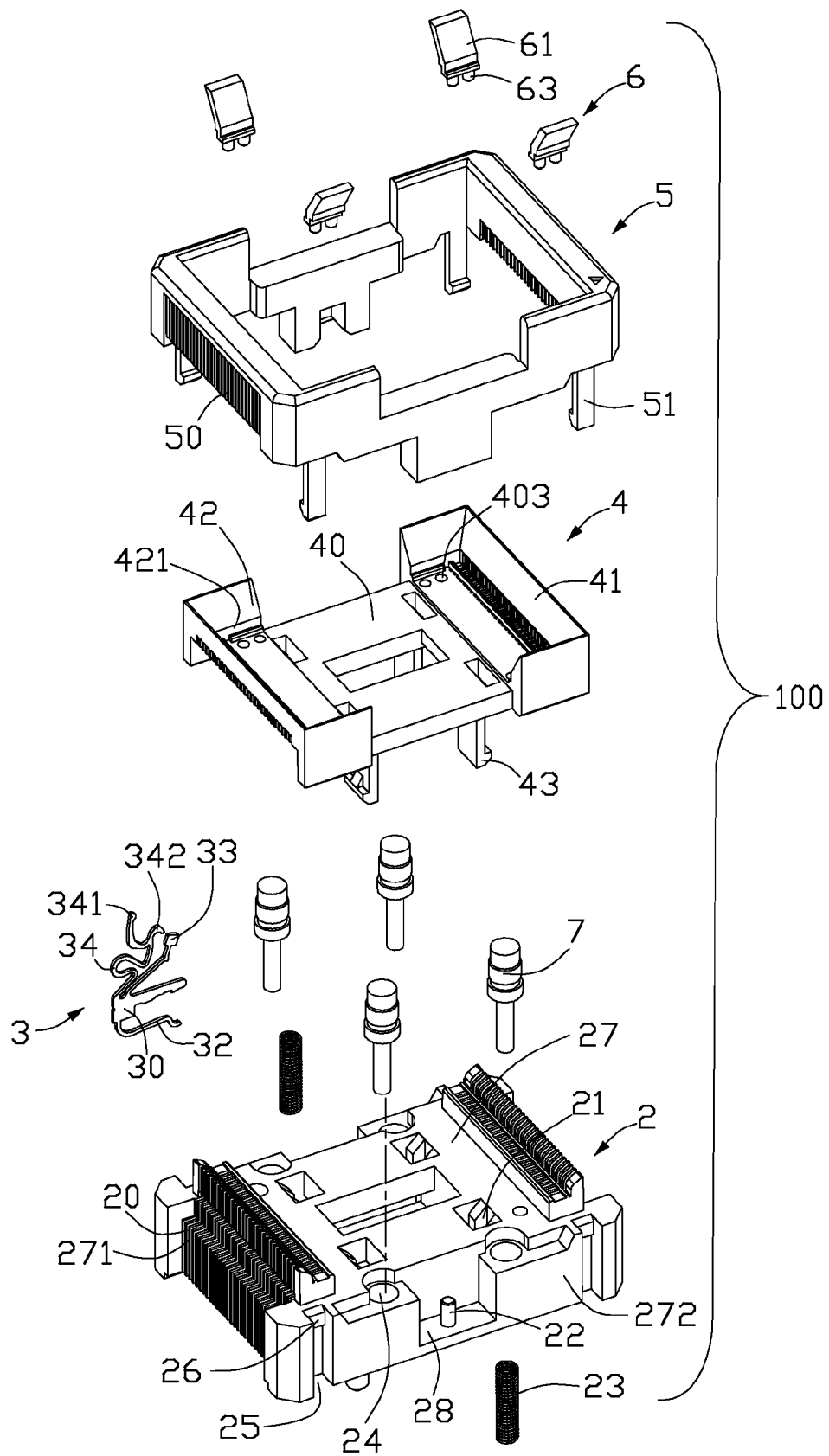
FIG. 3 is an exploded perspective view of the electrical connector as shown in FIG. 1.
Figure 4:
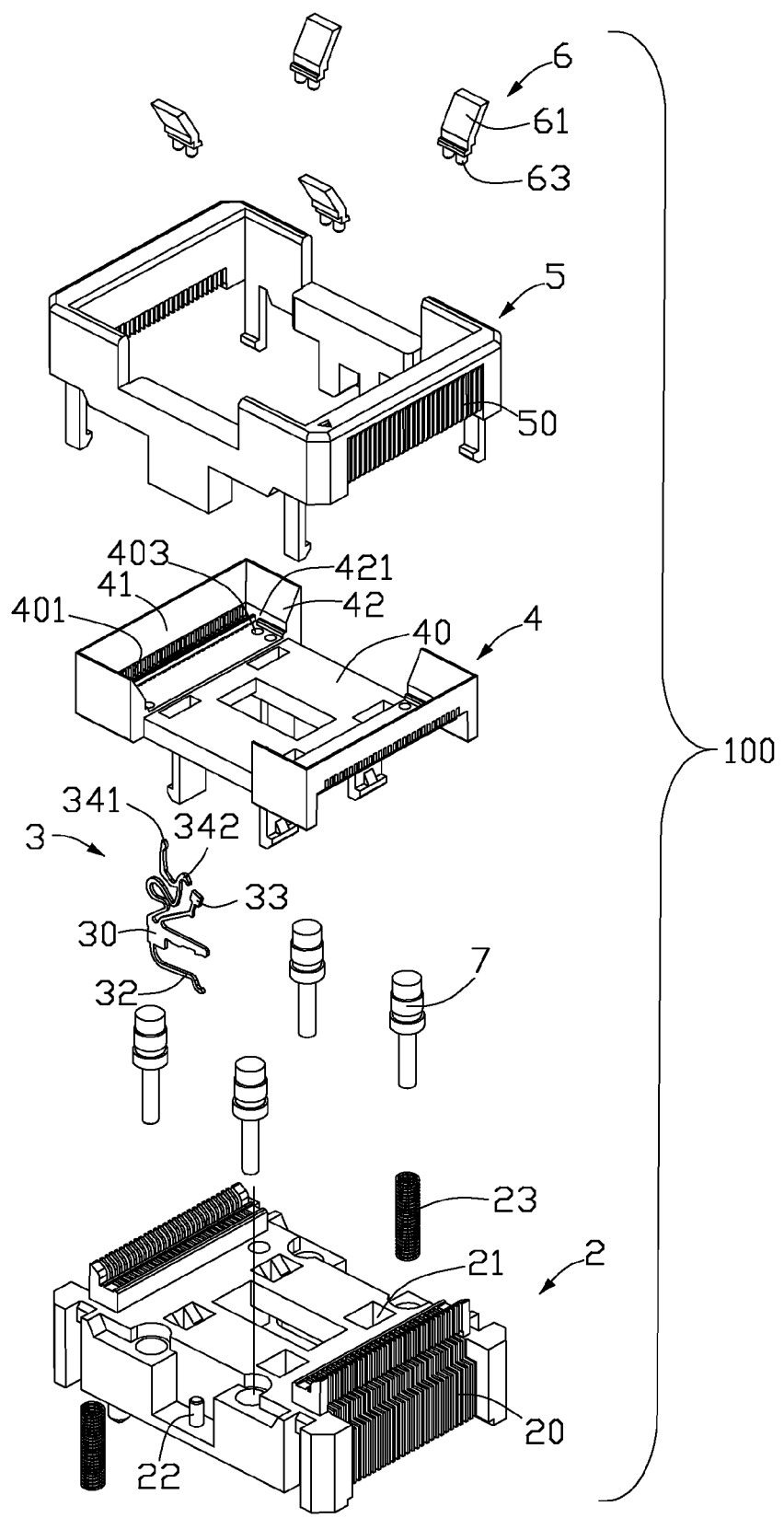
FIG. 4 is another exploded perspective view similar to FIG. 3, taken from another aspect.

Referring to FIGS. 3 and 4, the insulative housing 2 comprises a base 27 having a pair of first side faces 271 and a pair of second side faces 272. The base 27 defines a plurality of latching recesses 21 and a plurality of through holes 24 at the outer side of the latching recesses 21. The insulative housing 2 defines a plurality of contact recesses 20 at the first side faces 271 for insertion of the contacts 3. The insulative housing 2 defines a plurality of sliding recesses 25 at the second side faces 272. Each sliding recess 25 has a blocking portion 26 formed therein. The insulative housing 2 has an opening 28 defined on each second side face 272 between two sliding recesses 25. The opening 28 is formed with an upwardly extending protrusion 22.

The contact 3 comprises a body portion 30, a soldering portion 32 formed at the bottom of the body portion 30, a first and a second beams 33, 34 extending from the body portion 30. The second beam 34 is located above the first beam 33 and comprises a first branch 341 and a second branch 342. The second branch 342 is located between the first branch 341 and the first beam 33.

The connecting member 4 comprises a connecting wall 40, a pair of primary walls 41 rising from opposite sides of the connecting wall 40, and a plurality of side walls 42 rising from the connecting wall 40. Each side wall 42 is connected to a respective side edge of the primary wall 41. The connecting wall 40 defines four pairs of mounting holes 403 at four corners thereof for mounting four guiding members 6. The connecting member 4 has a plurality of latching beams 43 extending downwardly from the connecting wall 40. The connecting wall 40 has a plurality of slits 401 communicating with the contact recesses 20 defined adjacent to the primary walls 41 for corresponding to the contacts 3.

The actuator 5 defines a plurality of contact slots 50 communicating with corresponding contact recesses 20 of the insulative housing 2. The actuator 5 is formed with a plurality of downwardly extending sliding beams 51.

The guiding member 6 comprises a guiding portion 61 and a pair of mounting posts 63 formed at the bottom of the guiding portion 61.

Referring to FIGS. 1-5, in assembling of the electrical connector 100, the contacts 3 are inserted in the contact recesses 20, and the springs 23 are encircled around the protrusions 22, and the bolts 7 are mounted in the through holes 24. The connecting member 4 is mounted on the insulative housing 2, with the latching beams 43 latching with the latching recesses 21. The guiding members 6 are mounted on the connecting wall 40, with the mounting posts 63 engaging with the mounting holes 403 and the guiding portion 61 abutting against the side wall 42. The actuator 5 is floatably mounted on the insulative housing 2 and supported by the springs 23, with the sliding beams 51 slidable in the sliding recesses 25. In conjunction with FIG. 5, the first branch 341 of the contact 3 is secured in the contact slot 50 of the actuator 5.

Figure 5:
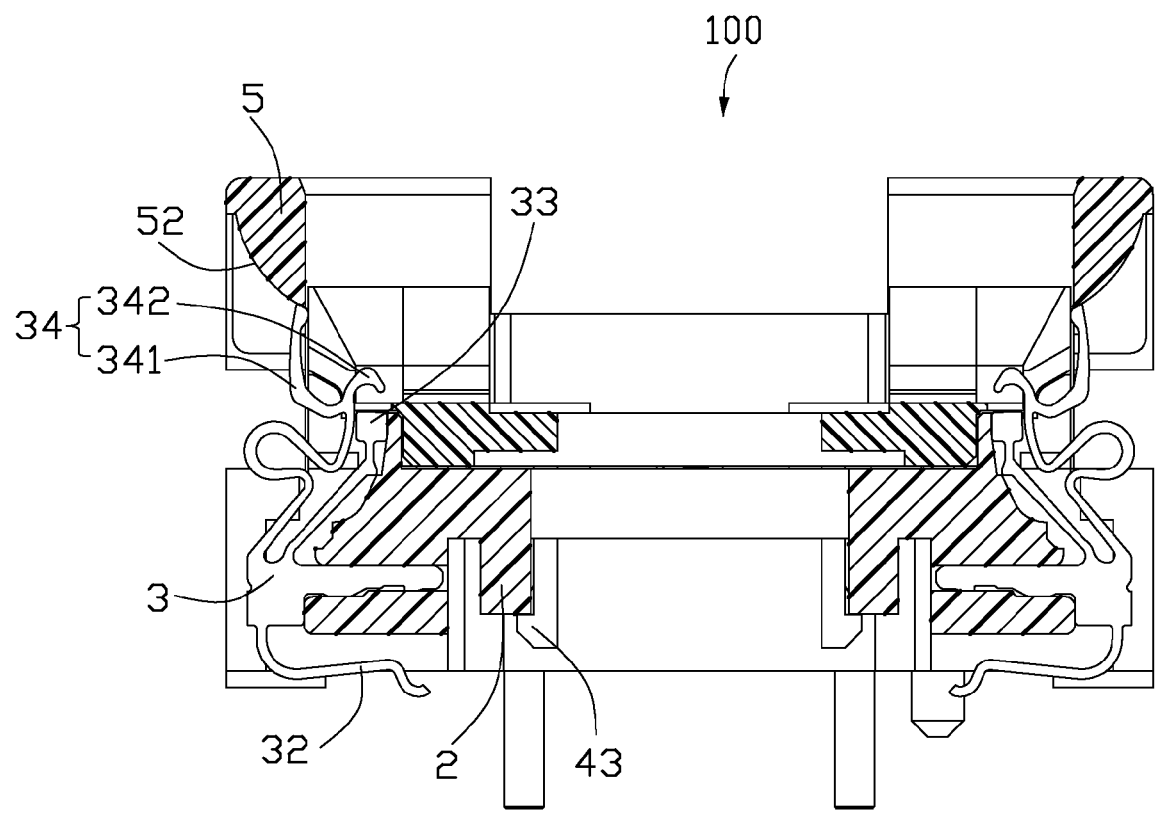
FIG. 5 is a cross-sectional view of the electrical connector, taken along line 5-5 of FIG. 1, when the electrical connector is located in a closed position, with the IC package being left out.
Figure 6:
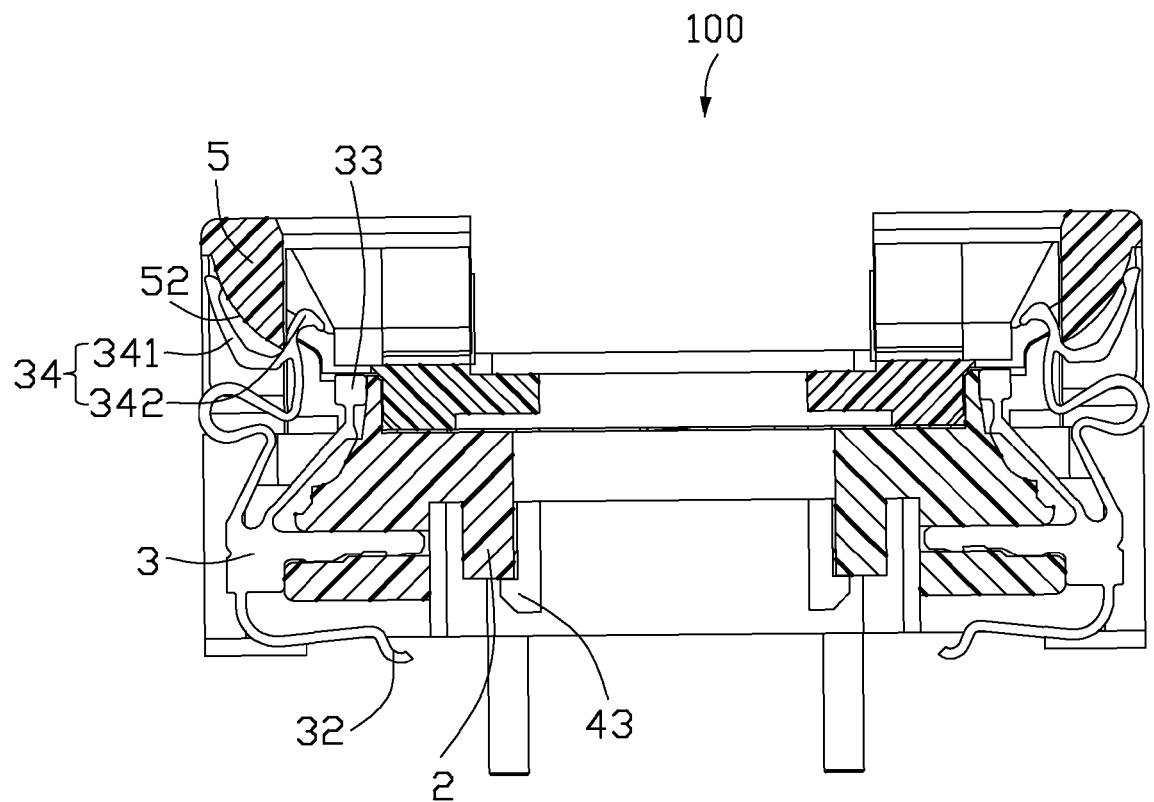
FIG. 6 is a cross-sectional view similar to FIG. 5, when the electrical connector is located in an opened position.
Figure 7:
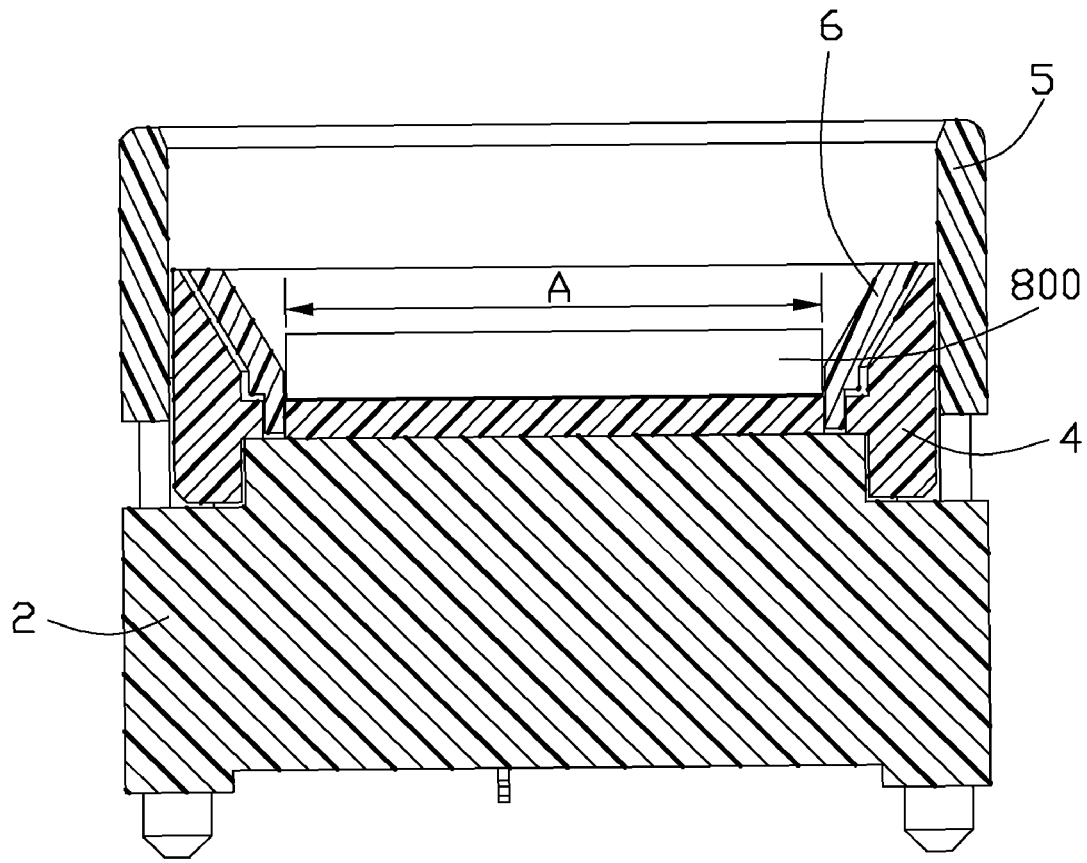
FIG. 7 is a cross-sectional view of the electrical connector, taken along line 7-7 of FIG. 1, when the guiding members are assembled to the connecting member.

FIGS. 1 and 7 show the electrical connector 100 connecting with a first IC package 800 having a first width A. In conjunction with FIGS. 5-6, when the actuator 5 is actuated downwardly, the first branches 341 of the contacts 3 are depressed by the actuator 5 and slide along an oblique face 52 of the actuator 5 to an opened position as shown in FIG. 6. The first IC package 800 is guided into the connecting member 4 by the guiding members 6. A connecting region of the connecting wall 40 surrounded by the primary walls 41 and the guiding members 6 is corresponding to the first IC package 800. When the actuator 5 is released, the actuator 5 restores to the initial position as shown in FIG. 5, under the resilient force provided by the springs 23. The second branch 342 and the first beam 33 clamp and electrically connect with the first IC package 800. The sliding beams 51 of the actuator 5 slide along the sliding recesses 25 and are blocked by the blocking portions 26.

Figure 2:
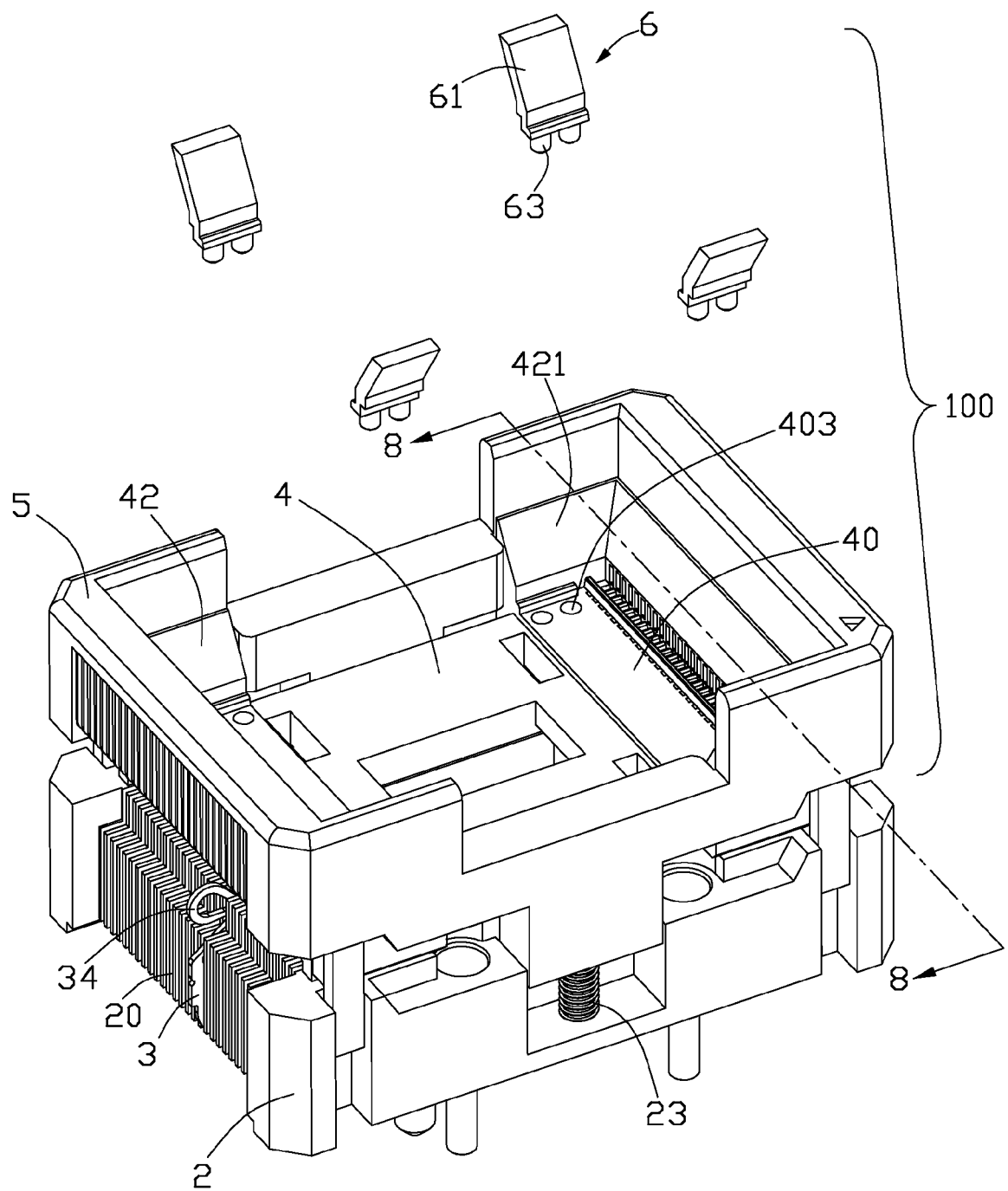
FIG. 2 is a view similar to FIG. 1, with the guiding members being removed.
Figure 8:
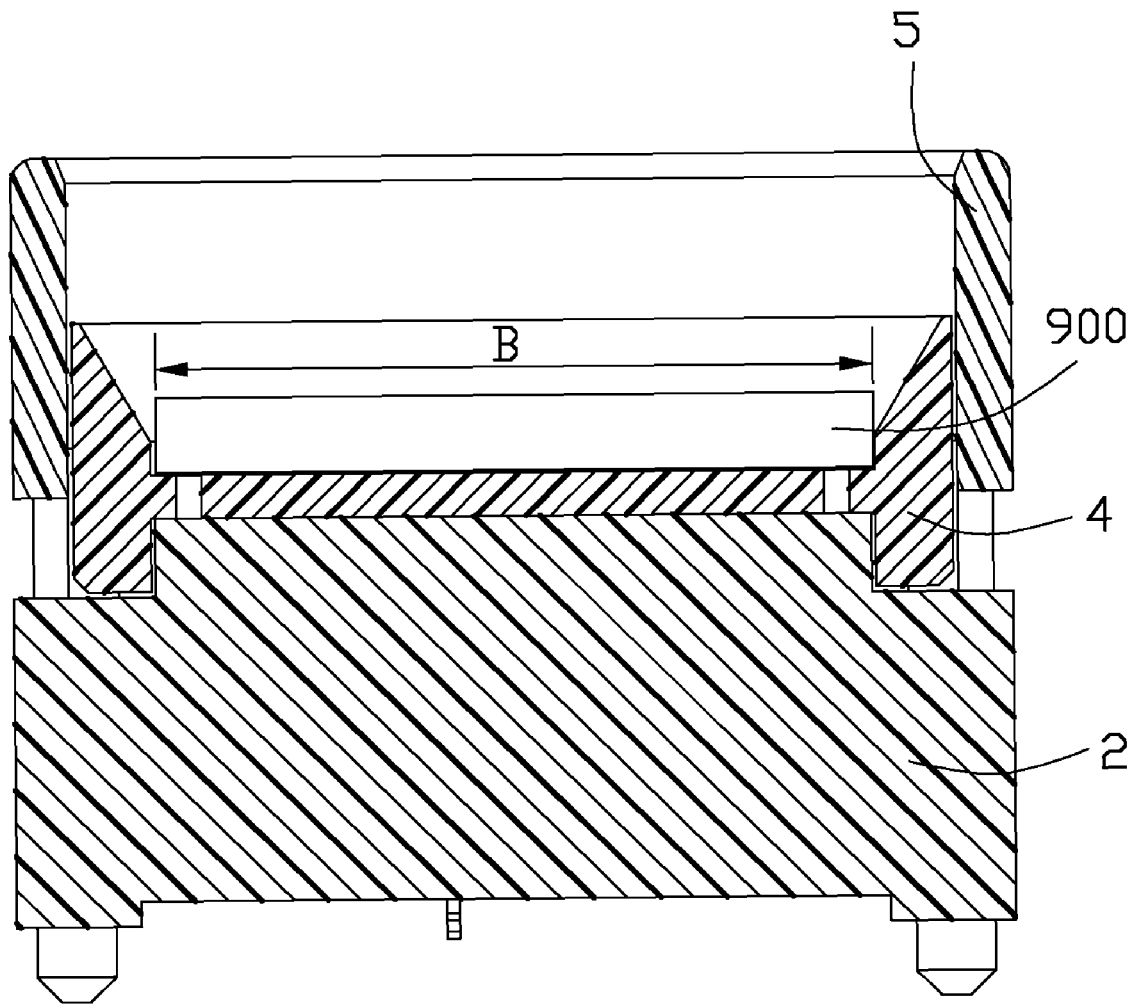
FIG. 8 is a cross-sectional view of the electrical connector, taken along line 8-8 of FIG. 2, when the guiding members are separated from the connecting member.

Referring to FIGS. 2 and 8, the guiding members 6 could be disassembled from the connecting member 4. When the guiding members 6 are disassembled, a second electronic package 900 having a second width B larger than the first width A could be mounted into the connecting member 4. A connecting region of the connecting wall 40 surrounded by the primary walls 41 and side walls 42 is corresponding to the second IC package 900. The second branches 342 and the first beams 33 of the contacts 3 are electrically connectable with the second IC package 900.

The electrical connector 100 could be connected with the first and second IC package 800, 900 having different widths, in a condition that the guiding members 6 are assembled to or disassembled from the connecting member 4. The guiding members 6 could be designed into different dimensions to connect with different types of IC package.

However, the disclosure is illustrative only, changes may be made in detail, especially in matter of shape, size, and arrangement of parts within the principles of the invention.

What is claimed is:

1. An electrical connector for electrically connecting a first IC package having a first width and a second IC package having a second width different from the first width, comprising: an insulative housing defining a plurality of contact recesses; a plurality of contacts inserted in the contact recesses; a connecting member mounted on the insulative housing; and a plurality of guiding members assembled to the connecting member for guiding the first IC package in the connecting member at a first state, and detachable from the connecting member for facilitating insertion of the second IC package in the connecting member at a second state, wherein said connecting member comprises a connecting wall, said connecting wall providing a first connecting region surrounded by the guiding members and corresponding to the first IC package at the first state, wherein said connecting member comprises a pair of rising walls rising from the connecting wall, said connecting wall providing a second region surrounded by the rising walls and corresponding to the second IC package at the second state, wherein each guiding member comprises a guiding portion and at least one guiding post formed at the bottom of the guiding portion, said connecting wall defining a plurality of mounting holes engageable with the guiding posts of the guiding members, wherein said rising walls of the connecting member comprise a pair of primary walls formed at opposite sides of the connecting wall, and a plurality of side walls each connected with a respective side edge of an associated primary wall, said guiding portion of the guiding member abutting against the side wall in the first state.

2. The electrical connector as claimed in claim 1, wherein said insulative housing defines a plurality of latching recesses, said connecting member has a plurality of latching beams extending downwardly from the connecting wall for latching with the latching recesses.

3. The electrical connector as claimed in claim 1, further comprising a plurality of springs mounted on the insulative housing, and an actuator supported by the springs.

4. The electrical connector as claimed in claim 3, wherein said insulative housing defines a plurality of sliding recesses and a plurality of blocking portions each formed in an associated sliding recess, and wherein said actuator is formed with a plurality of sliding beams each slidable in the sliding recess and blocked by the blocking portion.

5. The electrical connector as claimed in claim 3, wherein said contact comprises a body portion, a first and a second beams extending from the body portion for clamping and electrically connecting with corresponding IC package.

6. The electrical connector as claimed in claim 5, wherein said actuator is formed with a plurality of contact slots communicating with the contact recesses, said second beam of the contact comprising a first branch secured in the contact slot.

7. The electrical connector as claimed in claim 6, wherein said second beam of the contact comprises a second branch located between the first branch and the first beam, said first branch being operable by the actuator to urge the second branch and the first beam to engage with or disengage from the corresponding IC package.

* * * * *